United States Patent
Panay et al.

(10) Patent No.: US 11,672,096 B2
(45) Date of Patent: Jun. 6, 2023

(54) SEAMLESS TEXTILE COVERED ENCLOSURE

(71) Applicant: Microsoft Technology Licensing, LLC, Redmond, WA (US)

(72) Inventors: Panos Costa Panay, Redmond, WA (US); Young Soo Kim, Bellevue, WA (US); James Alec Ishihara, Bellevue, WA (US); Timothy Escolin, Seattle, WA (US); Byungkwan Min, Kirkland, WA (US); Ralf Groene, Kirkland, WA (US); Trevor Noah, New York City, NY (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 4 days.

(21) Appl. No.: 16/858,428

(22) Filed: Apr. 24, 2020

(65) Prior Publication Data

US 2021/0337689 A1    Oct. 28, 2021

(51) Int. Cl.
    *H05K 5/03* (2006.01)
    *G06F 1/16* (2006.01)
    *H05K 5/02* (2006.01)

(52) U.S. Cl.
    CPC ............. *H05K 5/03* (2013.01); *G06F 1/1698* (2013.01); *H05K 5/0226* (2013.01)

(58) Field of Classification Search
    CPC .................................. H05K 5/03; G06F 1/1698
    See application file for complete search history.

(56) References Cited

U.S. PATENT DOCUMENTS

| | | | | |
|---|---|---|---|---|
| 5,551,497 A | * | 9/1996 | Stanley | B41J 5/08 235/145 R |
| 5,661,633 A | * | 8/1997 | Patret | G06F 3/033 400/692 |
| 6,285,299 B1 | * | 9/2001 | King-DeBaun | G06F 3/0238 341/23 |
| 6,861,961 B2 | * | 3/2005 | Sandbach | H01H 13/785 178/18.05 |
| 9,223,352 B2 | * | 12/2015 | Smith | G06F 1/1698 |
| 9,588,551 B1 | * | 3/2017 | Hegde | G06F 1/181 |
| 10,056,205 B2 | * | 8/2018 | Hegde | G06F 1/1662 |
| 10,162,390 B2 | * | 12/2018 | Sweet | G06F 1/1688 |
| 10,362,670 B2 | * | 7/2019 | Cousins | A45C 13/005 |
| 10,590,600 B1 | * | 3/2020 | Wang | H01H 13/023 |
| 10,629,393 B2 | * | 4/2020 | Peterson | H01H 13/83 |
| 10,747,332 B2 | * | 8/2020 | Wang | G06F 3/0202 |
| 10,871,828 B2 | * | 12/2020 | Ligtenberg | G06F 3/0446 |
| 11,099,649 B2 | * | 8/2021 | Ligtenberg | G06F 3/0416 |
| 11,126,283 B2 | * | 9/2021 | Chen | G06F 3/0416 |

(Continued)

FOREIGN PATENT DOCUMENTS

CN    104869484 A    8/2015

OTHER PUBLICATIONS

"International Search Report and Written Opinion Issued in PCT Application No. PCT/US21/019144", dated Jun. 7, 2021, 14 Pages.

*Primary Examiner* — Rockshana D Chowdhury
*Assistant Examiner* — Douglas R Burtner
(74) *Attorney, Agent, or Firm* — Ray Quinney & Nebeker P.C.; Paul N. Taylor (57) ABSTRACT

An electronic device includes a body panel, a cap layer affixed to the body panel, and a covering enclosing external surfaces of the body panel such that the covering has no visible or tactile seams.

16 Claims, 7 Drawing Sheets

(56) References Cited

U.S. PATENT DOCUMENTS

| | | |
|---|---|---|
| 11,460,881 B2* | 10/2022 | Sugiyama ............. G06F 1/1615 |
| 2002/0134828 A1* | 9/2002 | Sandbach ............. G06F 1/1632 |
| | | 235/60.12 |
| 2005/0083306 A1* | 4/2005 | Monary ................ G06F 3/0202 |
| | | 345/168 |
| 2009/0291266 A1* | 11/2009 | Wakisaka .......... B29C 45/14786 |
| | | 156/245 |
| 2010/0051430 A1* | 3/2010 | Baller ................. H01H 25/041 |
| | | 200/341 |
| 2012/0296447 A1* | 11/2012 | Diller ...................... H05K 5/03 |
| | | 700/275 |
| 2013/0044215 A1* | 2/2013 | Rothkopf ............. G06F 1/1698 |
| | | 345/173 |
| 2014/0139991 A1* | 5/2014 | Gengler ............... G06F 1/1669 |
| | | 29/592.1 |
| 2014/0140556 A1 | 5/2014 | Yim et al. |
| 2014/0255899 A1* | 9/2014 | Poullain ............... G06F 1/1647 |
| | | 434/351 |
| 2014/0262715 A1* | 9/2014 | Lee ...................... H01H 13/704 |
| | | 200/513 |
| 2014/0293522 A1 | 10/2014 | Zhang et al. |
| 2015/0234108 A1* | 8/2015 | Harley, Jr. ............ G06F 1/1669 |
| | | 362/606 |
| 2015/0295615 A1* | 10/2015 | Smith ...................... A45C 5/02 |
| | | 455/575.8 |
| 2016/0345086 A1 | 11/2016 | Chamberlin et al. |
| 2017/0060190 A1* | 3/2017 | Hegde ............... B29C 45/14786 |
| 2017/0143088 A1* | 5/2017 | Sirichai .................. A45C 11/00 |
| 2017/0300089 A1* | 10/2017 | Hampton ............. G06F 1/1683 |
| 2018/0091901 A1* | 3/2018 | Stanley .................... F21V 5/007 |
| 2018/0270967 A1* | 9/2018 | Honma ................. H05K 5/0004 |
| 2018/0284845 A1* | 10/2018 | Honma ................ B29C 66/7392 |
| 2019/0321867 A1* | 10/2019 | Bates ...................... A47L 13/17 |
| 2019/0361543 A1* | 11/2019 | Zhang ................... G06F 3/0488 |
| 2019/0371543 A1* | 12/2019 | Chiang ............... G06F 3/03547 |
| 2020/0097052 A1 | 3/2020 | Makinen et al. |
| 2022/0372675 A1* | 11/2022 | Bogan ................. D03D 13/008 |

* cited by examiner

SEAMLESS TEXTILE COVERED ENCLOSURE

BACKGROUND

Background and Relevant Art

Electronic devices are commonplace in users' lives. The outer surface of a conventional electronic device is commonly a smooth metal or glass surface. As users become more dependent on and integrated with their portable devices, a metal or glass surface can result in the user losing a grip on the device and dropping the device. Further, the metal or glass finish is impersonal and provides limited options for customization and personalization of a device.

BRIEF SUMMARY

In some embodiments, a keyboard includes a body panel, a fabric covering, and a cap layer. The body panel has a top surface with a plurality of keys, a bottom surface, and an edge between the top surface and bottom surface. The fabric covering is adhered to the body panel and covers the bottom surface, the top surface, and the edge such at the covering is continuous from the bottom surface to the top surface with apertures for the plurality of keys. The fabric covering has no visible or tactile seams. The cap layer is affixed to the bottom surface with a seal between the cap layer and the bottom layer. A portion of the fabric covering of the body panel at the seal is compressed between the cap layer and the body panel to reduce a gap size between the body panel and the cap layer.

In some embodiments, a method of manufacturing an electronic device includes applying a fabric covering to a body panel, where the body panel has a top surface, a bottom surface, and at least one edge between the top surface and bottom surface. The method further includes wrapping the covering around the at least one edge from the bottom surface to the top surface such that the covering is continuous from the bottom surface to the top surface and compressing the covering against the top surface with a cap layer to plastically deform the covering at a seal on the top surface.

In some embodiments, an electronic device includes a body panel, a cap layer affixed to the body panel, and a covering enclosing external surfaces of the body panel such that the covering has no visible or tactile seams.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the disclosure may be realized and obtained by means of the instruments and combinations particularly pointed out in the appended claims. Features of the present disclosure will become more fully apparent from the following description and appended claims or may be learned by the practice of the disclosure as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which:

FIG. 2-1 is a top perspective view of an electronic device with a seamless covering on a body panel, according to at least some embodiments of the present disclosure;

FIG. 2-2—is bottom perspective view of the electronic device of FIG. 2-1, according to at least some embodiments of the present disclosure;

FIG. 3-1 is a perspective view of an electronic device with a seamless covering on a body panel according to at least some embodiments of the present disclosure;

FIG. 3-2 is a side cross-sectional view of the electronic device of FIG. 3-1, according to at least some embodiments of the present disclosure;

FIG. 3-3 is a detail view of the electronic device of FIG. 3-1, according to at least some embodiments of the present disclosure;

FIG. 5-1 is a side cross-sectional view of an electronic device with a first portion and second portion connected by a hinge, according to at least some embodiments of the present disclosure;

FIG. 5-2 is an exploded perspective view of the electronic device of FIG. 5-1, according to at least some embodiments of the present disclosure;

DETAILED DESCRIPTION

The present disclosure relates generally to systems and methods for manufacturing an electronic device with a continuous covering. In some embodiments, the continuous covering wraps around the edges of the device to provide a smooth edge without any visible seam. In some embodiments, the continuous covering is position under and held in place by an input device, display device, or other component of the electronic device. In some embodiments, the covering is radio frequency (RF) transparent to allow RF signals to pass through the covering while covering one or more RF windows in the housing of the electronic device. More particularly, the present disclosure relates to systems and methods of manufacturing an electronic device housing with a covering that exhibits no seams visible or touchable by a user.

In some embodiments, an electronic device has a housing that comprises one or more body panels. Each of the body panels partially defines an internal volume of the electronic device, and, when the body panels are assembled, the internal volume may contain the electronic components of the electronic device. In some embodiments, the body panels are covered in a textile and/or polymer covering. The covering may be seamless around a side of the device with an edge of the covering positioned under and/or held in place by another body panel or electronic component of the electronic device. In some embodiments, the textile covering is flexible and/or elastic to allow the textile covering to bend or stretch around a hinge or other moveable connection of the electronic device.

In some embodiments, the body panels provide EM shielding to electronic components positioned in the internal volume. In some embodiments, the body panels include radiopaque material and an RF transparent window is provided in the body panel. A textile or polymer covering can overlap and visual hide the RF window, providing an appearance of a continuous outer surface, while allowing RF signal to pass through the RF window and the textile covering.

Figure 1:
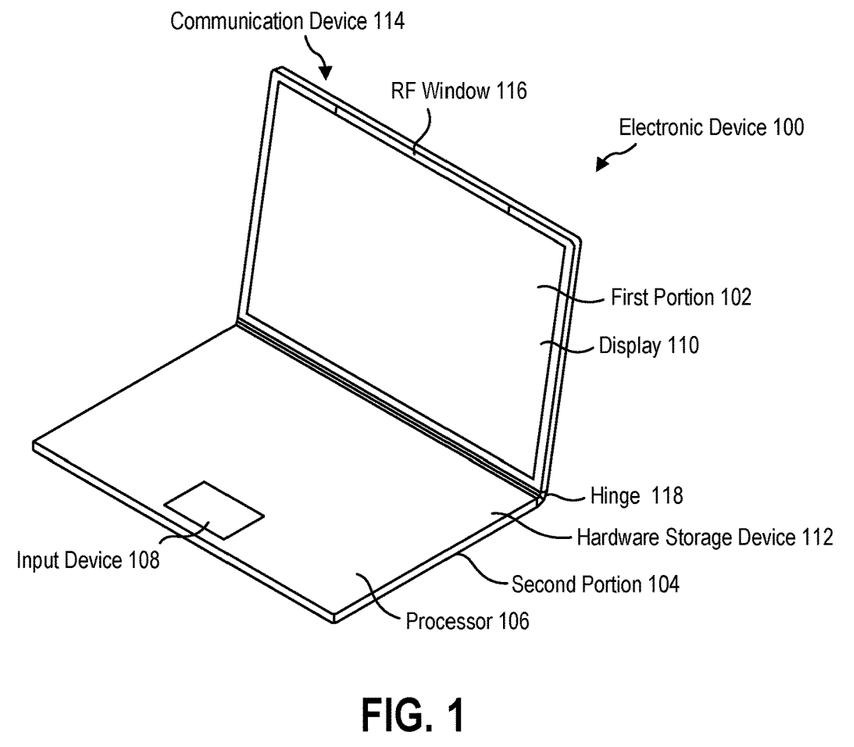
FIG. 1 is a perspective view of an electronic device with conventional body panels.

FIG. 1 is a perspective view of an embodiment of a conventional computing device that may have a covering applied according to the present disclosure. In some embodiments, the electronic device 100 has a plurality of hardware components with which the thermal module communicates. In some embodiments, the electronic device 100 is a laptop device as illustrated in FIG. 1. In some embodiments, the computing device is a tablet computing device, a hybrid computing device, a wearable computing device (e.g., a smartwatch, a head-mounted device, or other wearable device), a smart appliance (e.g., a smart television, a digital personal assistant or hub, an audio system, a home entertainment system, a home automation system, an in-car infotainment system), or other computer device.

In some embodiments, the electronic device 100 has a first portion 102 and second portion 104 that are movably connected to one another. The electronic device 100 includes various components located in or one the portions of the electronic device 100 that are in data communication through one or more buses and interfaces. In some embodiments, the thermal module establishes and uses two-way communication with one or more of the components. Examples of components include a processor(s) 106, input device(s) 108, display(s) 110, hardware storage device(s) 112, communication device(s) 114, and other components.

In some embodiments, the processor(s) 106 is a central processing unit (CPU) that performs general computing tasks for the electronic device 100. In some embodiments, the processor(s) 106 is or is part of a system on chip (SoC) that is dedicated to controlling or communicating with one or more subsystems of the electronic device 100.

In some embodiments, the display(s) 108 is a liquid crystal display (LCD), a light emitting diode (LED) display, a thin film transistor (TFT) display, a cathode ray tube (CRT) display, or other display. In some embodiments, the display 108 is integrated into the electronic device 100, such as illustrated in the embodiment of FIG. 1. In some embodiments, the display 108 is a discrete monitor or other display that is in wired or wireless data communication with the electronic device 100.

In some embodiments, the input device(s) 108 is a mouse, a stylus, a trackpad, a touch-sensitive device, a touch-sensitive display, a keyboard, or other input human-interface device. In some embodiments, the input device(s) 108 is part of the electronic device 100, such as a trackpad or a keyboard. In some embodiments, the input device(s) 108 is a discrete device in data communication with the electronic device 100, such as a stylus in wireless data communication with the electronic device 100.

In some embodiments, the hardware storage device(s) 112 is a non-transient storage device including any of RAM, ROM, EEPROM, CD-ROM or other optical disk storage (such as CDs, DVDs, etc.), magnetic disk storage or other magnetic storage devices, or any other medium which can be used to store desired program code means in the form of computer-executable instructions or data structures and which can be accessed by a general purpose or special purpose computer.

In some embodiments, a communication device(s) 114 is in data communication with the processor(s) 106 to allow communication with one or more external computing devices, networks, or components. In some embodiments, the communication device is a network communications device, such as a wireless (e.g., Wi-Fi) antenna. In some embodiments, the communication device is a short-range wireless communication, such as a BLUETOOTH connection or a Wi-Fi-Direct connection, that allows data communication between the electronic device 100 and electronic devices in proximity to the electronic device 100. In some embodiments, the communication device is a near-field communications (NFC) device that is used for data communication, wireless charging of other components and/or accessory devices, or both. In some embodiments, an RF window 116 in the first portion 102 and/or second portion 104 allows the communication device 114 to broadcast and receive RF signals through the housing of the electronic device 100.

In a conventional device, the first portion and/or second portion is formed of a rigid material. The rigid material of the electronic device 100 housing requires seams and breaks in the material to provide a hinge 118. Additionally, the rigid material may exhibit obvious seams and discontinuities at the RF window 116 or at other components, such as an input device. The rigid material, such as metal or polymer, is typically smooth and industrial feeling to the user's touch. The surface can be perceived as impersonal or uninviting to users.

Conventional textile or polymer coverings have employed seams at the edges of the housing. For example, a textile covering of the second portion 104 may bond a first (e.g., upper) sheet of covering to a second (e.g., lower) sheet of covering with a prayer seam around the entire edge of the second portion 104. In another example, a textile covering may include a single sheet that is folded around a first side of the edge of the second portion 104 and bonded around the remaining three sides of the edge of the second portion. Such a prayer seam, however, is located in a high wear area and can be a failure point, as well as being unpleasant visually and tactilely to a user.

Because the components described herein are susceptible to electromagnetic damage or interference, the housing of the electronic device is conventionally radiopaque. In some embodiments, a RF window in the first portion and/or second portion allows the communication device to broadcast and receive RF signals through the housing of the electronic device. In some embodiments, the covering material is radiotransparent to allow RF signals through the covering without visible seams or welds.

In some embodiments, an electronic device according to the present disclosure includes a body that supports one or more of the electronic components described herein. A covering is applied to the body to improve the visual appeal, such as finish material, texture, luster, etc.; tactile appeal such as compliance, softness, conformity, etc.; grip; durability; and other properties of the electronic device. For example, a seamless covering that wraps around a portion of the device may be aesthetically pleasing to a user and/or may be more comfortable to hold and use. In some examples, a seamless covering may provide abrasion resistance and be more durable than the housing without the covering. In some examples, a seamless covering may provide a user with a more easily gripped surface for carrying a portable electronic device than a conventional metal or plastic surface.

In some embodiments, an electronic device has a display and/or an input device affixed to the body. In some embodiments, the display is a touch-sensitive display and the display and input device are one and the same. In some embodiments, the body of the electronic device has one or more openings to access connection ports and allow communication with other electronic components located in an interior volume of the electronic device.

A covering is applied to the body, in some embodiments, before at least some of the components are affixed to the body. At least one of the components that is later affixed to the body may apply a force to the covering to hold the covering in contact with and/or in place on the body. In some embodiments, the covering extends from a first edge of the body to a second edge of the body. In some embodiments, the covering is continuous around the body and at least a portion of the covering is positioned underneath a component or a cap layer (e.g., between the component or cap layer and the body). In some embodiments, the outer surface of the body of the electronic device is entirely covered by the covering, with only components of the electronic device (e.g., display, input device, speaker grill) interrupting the covering on the outer surface.

In some embodiments, the covering seamlessly wraps around at least one edge of the body such that the covering material is continuous from a top surface of the body to a bottom surface of the body. In contrast to a conventional covering applied to a body, there is no prayer seam or weld along the edge and there is no butt seam where two pieces of the covering material are adjacent to and/or contact one another at their respective edges. Each conventional design introduces potential failure or delamination points and can produce unpleasant tactile experiences for a user.

Figure 21:
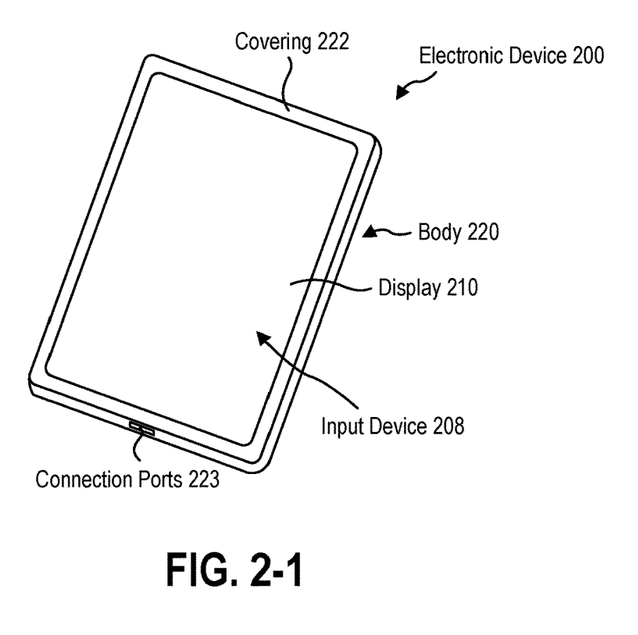

FIG. 2-1 is a top perspective view of an embodiment of an electronic device 200 with a seamless covering 222, according to the present disclosure. In some embodiments, the electronic device 200 is a tablet or hybrid device that includes a display 210 that is also an input device 208. The covering 222 provides a seamless outer surface to the body 210 of the electronic device 200 around the display 210 and between the display 210 and the aperture for the connection ports 223. In some embodiments, the display 210 or part of the display 210 is a cap layer that compresses a portion of the covering 222 to retain and/or anchor the covering 222 on the body 220 of the electronic device 200.

Figure 22:
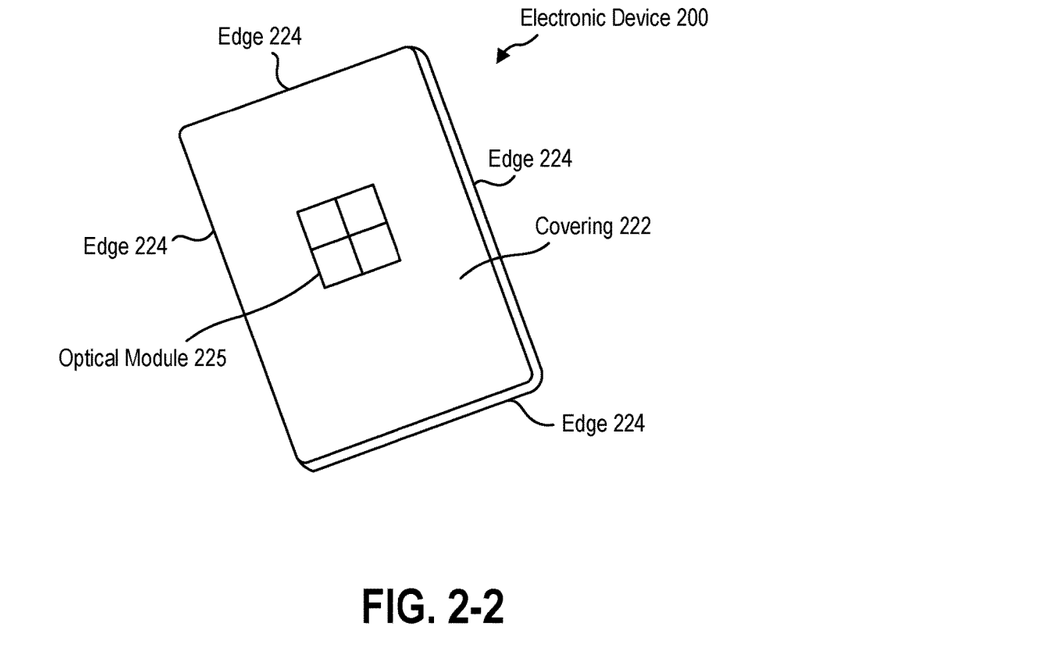

FIG. 2-2 is a bottom perspective view of the embodiment of an electronic device 200 of FIG. 2-1. In some embodiments, the covering 222 is seamless and continuous around an edge 224 of the electronic device 200 housing. In some embodiments, the covering 222 is seamless and continuous between at least two edges 224 of the electronic device 200. In some embodiments, the covering 222 is seamless and continuous between at least four edges 224 of the electronic device 200. In some embodiments, the covering 222 is seamless and continuous between all edges 224 of the electronic device 200.

The electronic device 200 may have a logo or other identifying mark in the bottom or back surface of the device. In some embodiments, an optical module 225 provides an illuminated logo in the back surface of the device. In some embodiments, the optical module 225 is a cap layer that compresses and retains the covering 222 in place across a portion of the back surface and provides an anchor for the covering 222 around the edges 224 to where the covering is further compressed and retained by the display 210, as described in relation in FIG. 2-1. In this way, some or all of the components of the electronic device 200 positioned on the outer surface of the electronic device 200 can compress and/or anchor the covering 222 on the body 220.

Figure 31:
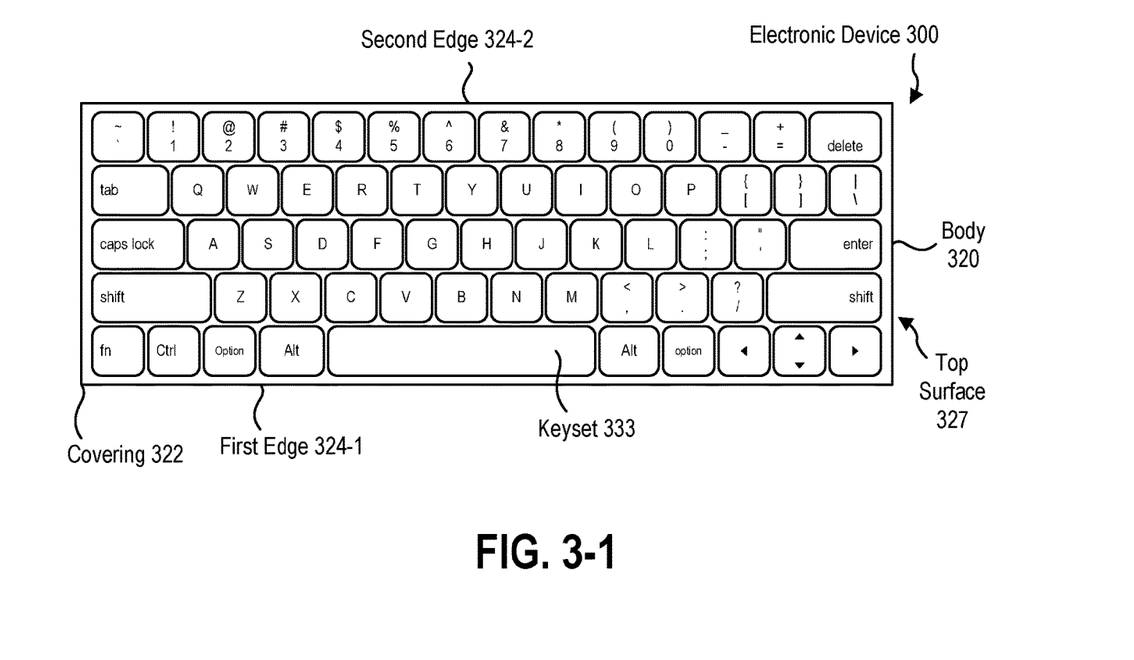
Figure 32:
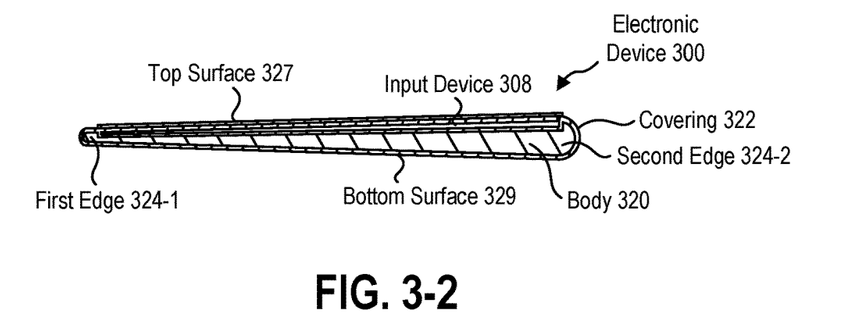

In some embodiments, a covering according to the present disclosure wraps around a plurality of edges of the body. FIG. 3-1 is a top view of another embodiment of an electronic device 300 according to the present disclosure and FIG. 3-2 is a side cross-sectional view of the electronic device 300. The covering 322 may wrap around a first edge 324-1 of the body 320 from a top surface 327 having a keyset 333 thereon to a bottom surface 329 and continue across the body 320 to a second edge 324-2 of the body 320 where the covering 322 wraps the second edge 324-2 from the bottom surface 329 to the top surface 327. In some embodiments, the covering 322 further continues across the top surface 327 to first edge 324-1 as a continuous loop of material with apertures cut therein to allow the keyset 333 to be positioned therethrough. In some embodiments, the covering 322 is compressed under a cap layer 328 that supports the keyset 333.

The first edge 324-1 and second edge 324-2 may be positioned opposite one another, such as a front edge of a laptop keyboard and an opposing rear edge of the laptop keyboard. In another example, the first edge 324-1 is a top edge of a tablet computer display (e.g., the top portion of the bezel) and the second edge 324-2 is an opposing bottom edge of the tablet computer. In another example, the first edge 324-1 is a left edge of a foldable mobile computing device (e.g., a book-style folding device) when in an open posture and the second edge 324-2 is a right edge of the foldable mobile computing device.

In some embodiments, the covering wraps around all edges of the body, such as all four edges of a rectangular device (e.g., a tablet computing device, a first portion or a second portion of a laptop-style device); three edges of a triangular device (e.g., a speaker); or a curved edge or edges of a rounded rectangular device, a circular device, or an elliptical device (e.g., a wearable device).

Figure 33:
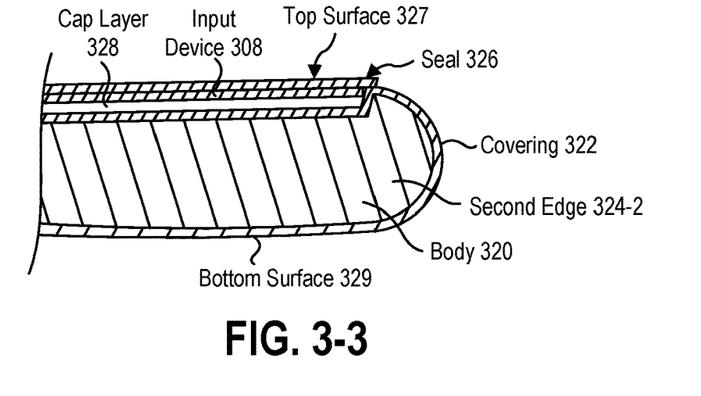

Referring now to FIG. 3-3, a detail view of the second edge 324-2 of FIG. 3-2 shows a seal 326 formed by compressing a portion of the covering 322. In some embodiments, the covering 322 is crushed by an overlapping cap layer 328. The fibers or material of the covering 322 may be plastically deformed by the contact with the cap layer 328 and between the cap layer 328 and the body 320. In some embodiments, the cap layer 328 is positioned against the body 320 to form with the seal 326 with a pressure greater than 50 pounds per square inch (psi). In some embodiments, the cap layer 328 is positioned against the body 320 to form with the seal 326 with a pressure greater than 35 psi. In some embodiments, the cap layer 328 is positioned against the body 320 to form with the seal 326 with a pressure greater than 60 psi.

In some embodiments, the pressure is applied with heat to heat at least the covering 322 at the seal 326 in a range having an upper value, a lower value, or upper and lower values including any of 50° Celsius (C), 55° C., 60° C., 65° C., 70° C., 75° C., 80° C., 85° C., 90° C., or any values therebetween. In some embodiments, the temperature is greater than 50° C. In some embodiments, the temperature is less than 90° C. In some embodiments, the temperature is between 50° C. and 90° C. In some embodiments, the temperature is between 55° C. and 80° C. In some embodiments, the temperature is between 60° C. and 70° C. In some embodiments, the temperature is about 60° C.

In some embodiments, the pressure is applied for a time duration in a range having an upper value, a lower value, or upper and lower values including any of 10 seconds, 15 seconds, 20 seconds, 25 seconds, 30 seconds, 35 seconds, 40 seconds, 45 seconds, 50 seconds, 55 seconds, 60 seconds, or any values therebetween. In some embodiments, the time duration is greater than 15 seconds. In some embodiments, the time duration is less than 60 seconds. In some embodiments, the time duration is between 15 and 60 seconds. In some embodiments, the time duration is between 15 and 45 seconds. In some embodiments, the time duration is between 15 and 30 seconds. In some embodiments, the time duration is about 20 seconds. In at least one embodiment, the time duration is about 20 seconds and is applied at about 50 psi and 60° Celsius.

In some embodiments, the cap layer 328 crushes the fibers and mechanically restrains the covering 322 such that the covering 322 does not move relative to the cap layer 322 at the seal 326. In some embodiments, the portion of the covering material 322 contacting the cap layer 328 is restrained by the cap layer 328, but other portions of the covering 322 are able to move relative to the cap layer 328. By allowing other portions to move, the covering 322 may elastically deform and/or slide on a surface of the body 320 in response to changes in the electronic device's posture or shape.

In some embodiments, the thickness of the covering material is substantially uniform across the covering 322 (e.g., within 5% to 10% of an average thickness). In some embodiments, the thickness of the covering material varies across the covering 322. The thickness may change at or near the seal 326 with the cap layer 328. For example, the covering 322 may be thinner near the seal 326 to reduce compliance between the cap layer 328 and the body 320 when the cap layer 328 forms an interference fit with the body 320. In another example, the covering 322 may be thicker at or near the seal 326 to allow a larger amount of deformation of the covering 322 and limit gaps forming in the seal 326 that are aesthetically unpleasant and/or potential failure points.

In some embodiments, the cap layer 328 is part of an electronic component of the electronic device. For example, the cap layer 328 that plastically deforms the covering 322 may be a cover glass for a display (e.g., display 210 described in relation to FIG. 2-1). In some examples, the cap layer 328 may be a PCB underneath an input device (e.g., input device 108 described in relation to FIG. 1). In some examples, the cap layer 328 may be a plate for a keyboard or other input device. In some embodiments, the cap layer is a second body panel 420-2 of the body, as shown in FIG. 4, and the body panels 420-1, 420-2 define an interior volume 430 in which electronic components may be positioned.

Figure 4:
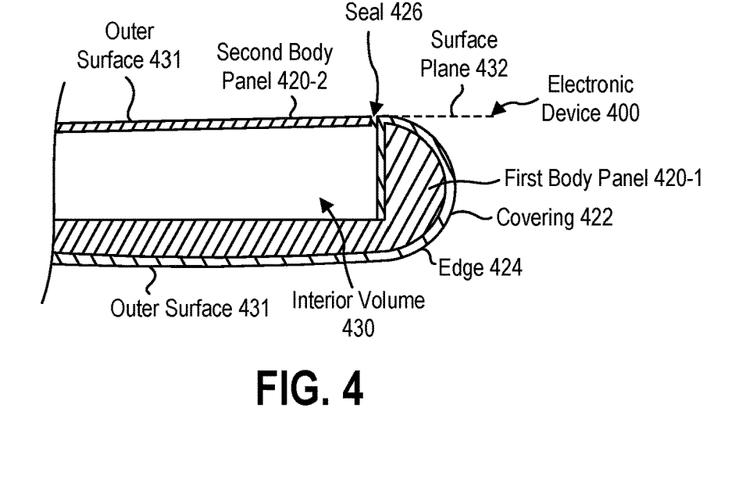
FIG. 4 is a side cross-sectional view of another electronic device with a seamless covering on a body panel, according to at least some embodiments of the present disclosure.

As shown in the cross-sectional view of FIG. 4, the outer surface 431 of the electronic device 400 at the seal 426 of the covering 422, in some embodiments, is substantially flush with little or no discernible relief in a surface plane 432. In some embodiments, a step (e.g., between the second body panel 420-2 and the covering 422) in the surface plane 432 across the seal 426 is less than 1 millimeter. In some embodiments, a step in the surface plane 432 across the seal 426 is less than 0.4 mm. In some embodiments, a step in the surface plane 432 across the seal 426 is less than 0.2 mm. In some embodiments, a step in the surface plane 432 across the seal 426 is less than 0.1 mm.

In some embodiments, a gap between the cap layer (i.e., the second body panel 420-2 in FIG. 4) and the body panel (i.e., the first body panel 420-1 in FIG. 4) at the seal 426 is less than 0.5 mm. In some embodiments, a gap between the cap layer and the body panel at the seal 426 is less than 0.25 mm. In some embodiments, a gap between the cap layer and the body panel at the seal 426 is less than 0.1 mm.

In some embodiments, the cap layer (i.e., the second body panel 420-2 in FIG. 4) is removable, such as to facilitate repair or modification of the electronic components of the device. When the cap layer is removed the compression on the seal is removed. In some embodiments, the covering 422 is then removable or replaceable for cleaning, repair, or modification.

In some embodiments, the covering 422 is pulled taut around at least one edge 424 and/or across a surface of the body 420-1, 420-2. In some embodiments, at least a portion of the covering 422 is adhered to the body 420-1, 420-2 with an adhesive (e.g., a pressure sensitive adhesive layer) positioned between the covering 422 and the body panel 420-1, 420-2. For example, the covering 422 may be adhered to the bottom surface of a body panel 420-1, 420-2 while allowing a portion of the covering 422 to slide relative to the body panel 420-1, 420-2 around an edge 424 of the body panel 420-1, 420-2.

When the covering is free to slide on the edge, the covering can stretch as the cap layer contacts and deforms a part of the covering at the seal. In some embodiments, the cap layer can be a protective/durable layer that provides wear resistance. In some embodiments, the cap layer can be part of an electronic component of the electronic device, such as part of the display, part of an input device, or part of another electronic component or bezel around an electronic component such as connection ports.

The covering may extend over surfaces and edges of the electronic device and conceal underneath it one or more electronic components that emit and/receive a signal through the covering. In some embodiments, a communication device emits and/or receives a RF signal and the covering material is radiotransparent. In some embodiments, a communication device emits or receives an optical signal, and the covering material is translucent or transparent to the wavelengths of light of the optical signal. In some embodiments, at least one status light emits visible light through the covering.

In some embodiments, the covering material is textile, such as a printed, pressed, woven, or knit organic or synthetic fiber. In some examples, the textile includes wool, cotton, bamboo, hemp, polyester, polyurethane, nylon, silicone, TPU, organic or inorganic composites, or other fibers. In some embodiments, the covering material is a perforated material. In some examples, the perforated material allows light from an optical module through the perforations and is otherwise opaque to obscure the optical module when darkened. The perforated material may be leather, ALCANTARA®, a polymer, vinyl, metal, or other continuous material. In at least one example, the covering material spans a RF window gap in the housing, such as an open or perforated region of an aluminum housing. In at least another example, the covering material is a discrete layer applied to the housing of the electronic device, such as a transmissive textile or a perforated leather applied to an RF window, such as a radiotransparent polymer window.

As described herein, some embodiments according to the present disclosure have a covering that is partially fixed to the body and partially free to elastically deform and/or bend under tension from hinges or other changes in posture. In some embodiments, a covering is seamless and continuous around the edge(s) of a first portion to a second portion of an electronic device. The covering extends across a hinge or other flexible or movable portion connecting the first portion to the second portion.

Figure 51:
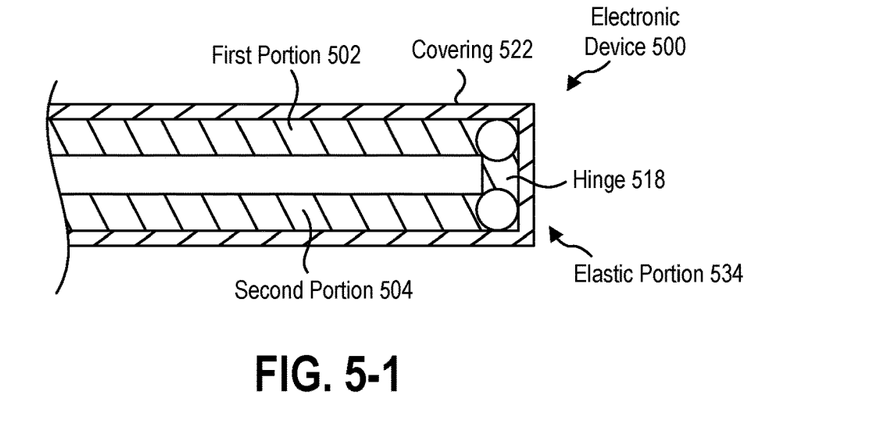
Figure 52:
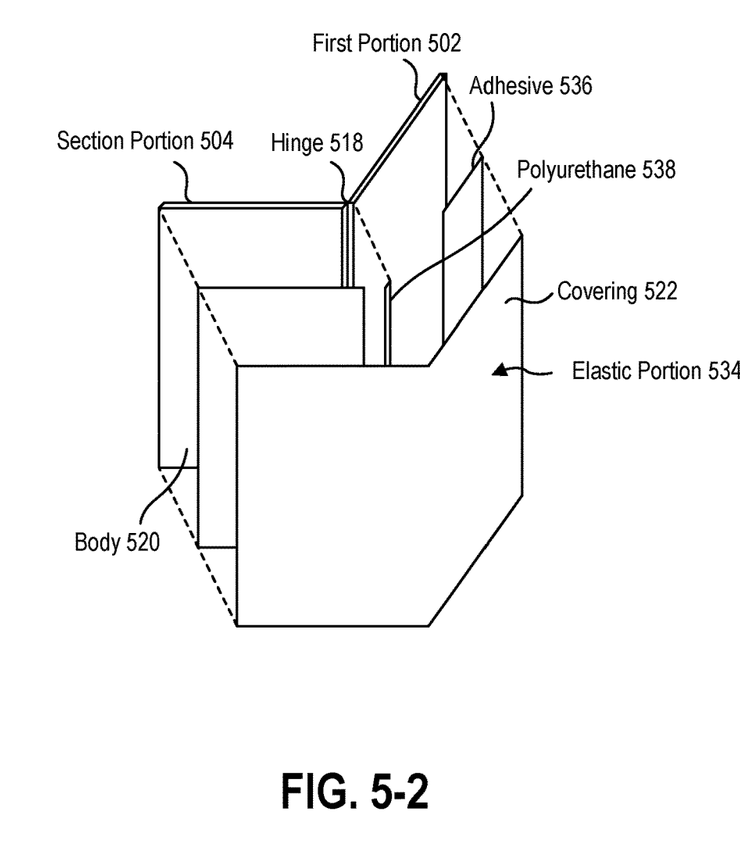

Referring now to FIGS. 5-1 and 5-2, when a user moves the hinge 518 to close the first portion 502 relative to the second portion 504, the covering 522 may elastically deform and/or bend over the hinge 528 to remain close to the hinge 518. When a user opens the electronic device 500 toward a book-style posture or a laptop posture shown in FIG. 5-2, the covering 522 contracts to remain in tension around the hinge 518.

In some embodiments, the covering is captured by a cap layer on the first portion and the second portion to affix the covering to the edges of the first portion and the second portion. FIG. 5-2 is an exploded perspective view of a book-style electronic device 500 in a book posture. In some embodiments, the covering 522 is additionally adhered to surfaces of the first portion 502 and the second portion 504 to limit and/or prevent movement or elastic deformation of the covering 522 across the surfaces. In some embodiments, a sheet of adhesive 536 (such as pressure sensitive adhesive) is positioned between a surface of the body 520 and the covering 522. To reduce wear of the covering 522 on the hinge 518 components, a low-friction material may be positioned, in some embodiments, between the covering 522 and the hinge 518. For example, a layer of polyurethane 538 is positioned to allow the covering 522 to slide past the hinge 518 without the covering 522 experiencing wear or damage from the hinge components and/or to allow the hinge 518 to operate without interference from the covering 522 or fibers from the covering material.

In some embodiments, a body of an electronic device has a bendable or foldable portion. The covering 522 is adhered to areas and/or surfaces of the electronic device proximate the bendable or foldable portion while allowing an elastic portion 536 of the covering 522 to stretch and/or contract during movement of the bendable or foldable portion.

Figure 6:
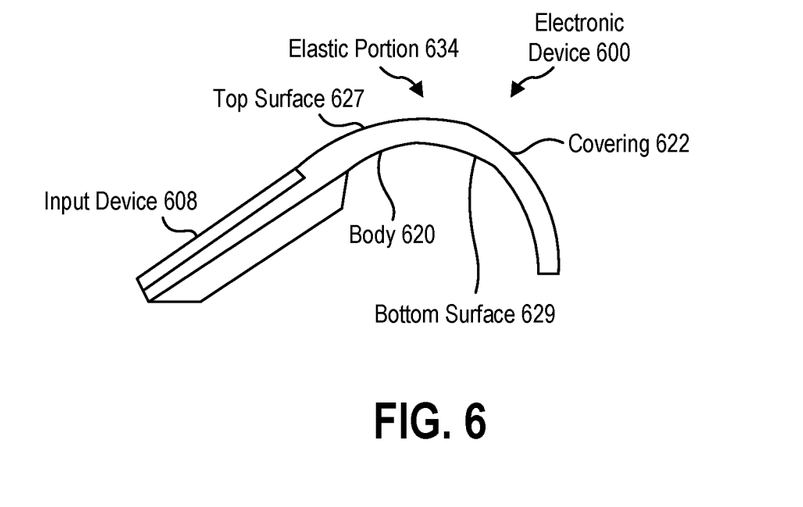
FIG. 6 is a side view of a computer mouse having in a curved active posture with a seamless covering stretched over a curved portion of the body, according to at least some embodiments of the present disclosure.

FIG. 6 is a side view of another embodiment of an electronic device 600 according to the present disclosure. A peripheral device, such as a mouse, has a flat inactive posture and a curved active posture. The electronic device 600 of FIG. 6 is turned on and enabled by bending a body 620 of the device into the curved active posture. In some embodiments, a covering 622 is positioned over the body 620 and compressed by an input device 608 that acts as the cap layer. The covering 622 may be adhered to a bottom surface 629 of the body 620 to limit and/or prevent separation of the covering 622 from the body 620, while the covering 622 adjacent the top surface 627 is allowed to elastically deform in the elastic portion 636 as the body 620 bends.

Figure 7:
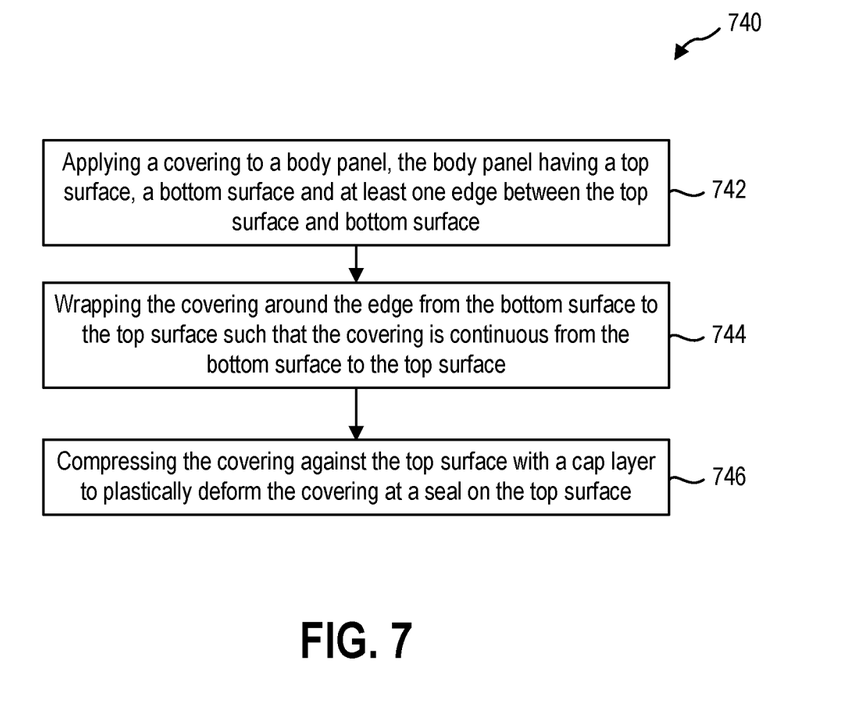
FIG. 7 is a flowchart illustrating a method manufacturing an electronic device with a seamless covering, according to at least some embodiments of the present disclosure.

Referring now to FIG. 7, in some embodiments, a method 740 of manufacturing an electronic device with a seamless covering includes applying (742) a covering to a body panel where the body panel has a top surface, a bottom surface, and an edge between the top surface and the bottom surface. The method further includes wrapping (744) the covering around the edge from the bottom surface to the top surface such that the covering is continuous from the bottom surface to the top surface. A cap layer is then pressed against the covering on the top surface to compress (746) and plastically deform the covering at a seal on the top surface. In some embodiments, the seal compresses the covering between the body panel and the cap layer in a direction perpendicular to the top surface. In some embodiments the cap layer is positioned in a recess or in the interior volume of the body panel.

Figure 8:
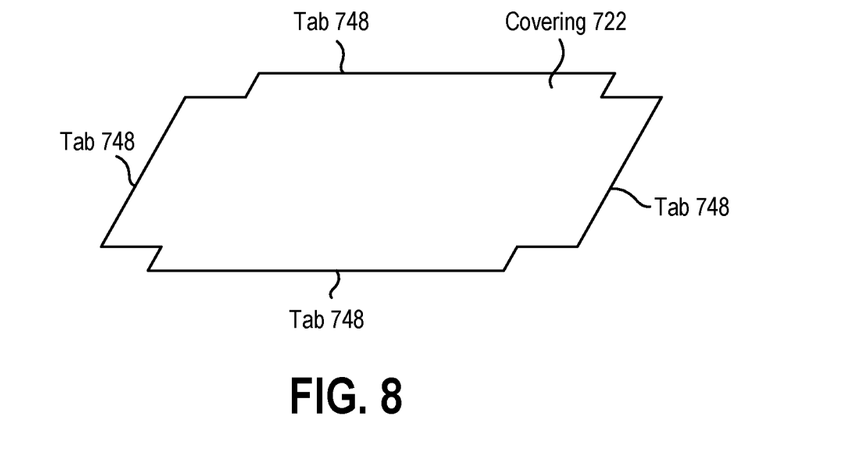
FIG. 8 is a perspective view of a covering used in the method of FIG. 7, according to at least some embodiments of the present disclosure.
Figure 9:
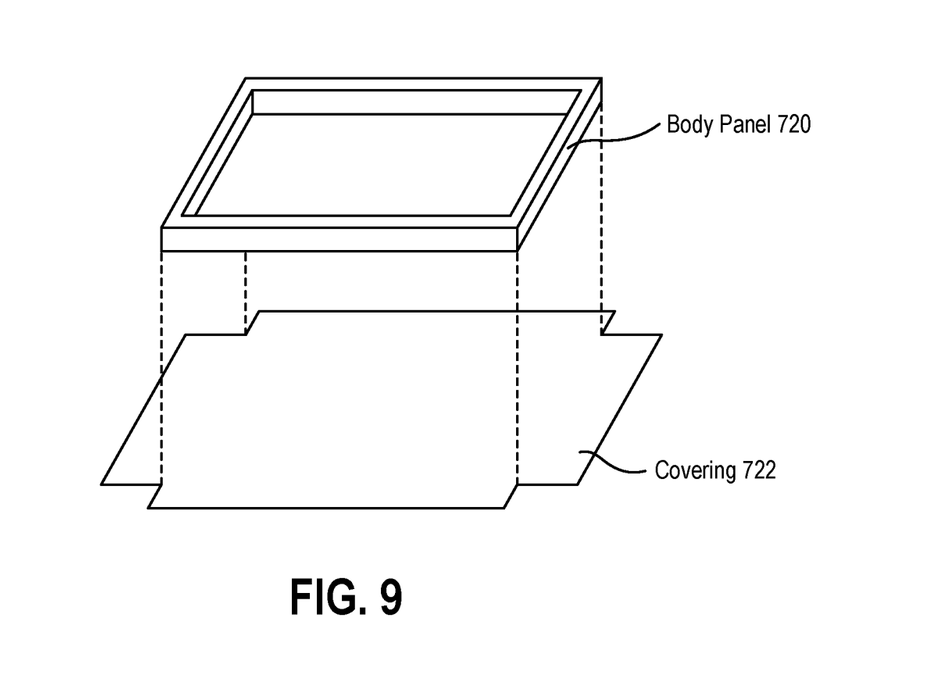
FIG. 9 is a perspective view of a body panel aligned with the covering of FIG. 8, according to at least some embodiments of the present disclosure.
Figure 10:
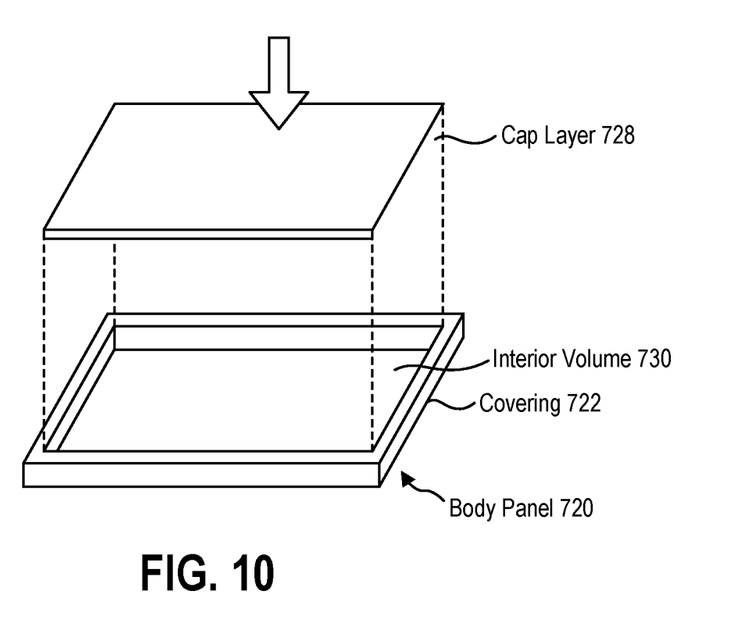
FIG. 10 is a perspective view of a cap layer being pressed into the body panel and compressing the covering of FIG. 9, according to at least some embodiments of the present disclosure.

FIG. 8 is a perspective view showing an embodiment of a covering 722. In some embodiments, the covering 722 has tabs 748 to wrap around the edges of a body panel. FIG. 9 illustrates an alignment of the covering 722 of FIG. 8 with a body panel 720. In the illustrated embodiment, the body panel 722 is a bucket for an electronic device, such as a tablet computer. In FIG. 10, the covering 722 is wrapped around the edges 724 of the body panel 720, and the cap layer 728 is pressed down into the interior volume 730 of the body panel 720 to compress the covering 722 against the body panel 720 and form the seal.

In some embodiments, the covering 722 is compressed in the seal between the body panel 720 and the cap layer 728 to less than 75% of an original thickness of the covering 722. In some embodiments, the covering 722 is compressed in the seal between the body panel 720 and the cap layer 728 to less than 60% of an original thickness of the covering 722. In some embodiments, the covering 722 is compressed in the seal between the body panel 720 and the cap layer 728 to less than 50% of an original thickness of the covering 722. In at least one example, a layer of ALCANTARA® is compressed from 0.62 mm to 0.35 mm in the seal.

INDUSTRIAL APPLICABILITY

The present disclosure relates generally to systems and methods for providing a seamless covering over an electronic device housing. The seamless cover can provide a visual and tactilely pleasing experience for a user, as well as improving durability of the cover by positioning edges, cuts, or other discontinuities of the covering material within a body of the device where there is less exposure to abrasion or impacts that could result in damage or delamination.

In some embodiments, the electronic device is a tablet computing device, a hybrid computing device, a wearable computing device (e.g., a smartwatch, a head-mounted device, or other wearable device), a smart appliance (e.g., a smart television, a digital personal assistant or hub, an audio system, a home entertainment system, a home automation system, an in-car infotainment system), or other computer device.

In some embodiments, the electronic device has a first portion and second portion that are movably connected to one another. The electronic device includes various components located in or one the portions of the computing device that are in data communication through one or more buses and interfaces. Examples of components include a processor(s), input device(s), display(s), hardware storage device(s), communication device(s), and other components.

In some embodiments, the processor(s) is a central processing unit (CPU) that performs general computing tasks for the electronic device. In some embodiments, the processor(s) is or is part of a system on chip (SoC) that is dedicated to controlling or communicating with one or more subsystems of the electronic device.

In some embodiments, the display(s) is a liquid crystal display (LCD), a light emitting diode (LED) display, a thin film transistor (TFT) display, a cathode ray tube (CRT) display, or other display. In some embodiments, the display is integrated into the electronic device. In some embodiments, the display is a discrete monitor or other display that is in wired or wireless data communication with the computing device.

In some embodiments, the input device(s) is a mouse, a stylus, a trackpad, a touch-sensitive device, a touch-sensitive display, a keyboard, or other input human-interface device. In some embodiments, the input device(s) is part of the electronic device, such as a trackpad or a keyboard. In some embodiments, the input device(s) is a discrete device in data communication with the electronic device, such as a stylus in wireless data communication with the electronic device.

In some embodiments, the hardware storage device(s) is a non-transient storage device including any of RAM, ROM, EEPROM, CD-ROM or other optical disk storage (such as CDs, DVDs, etc.), magnetic disk storage or other magnetic storage devices, or any other medium which can be used to store desired program code means in the form of computer-executable instructions or data structures and which can be accessed by a general purpose or special purpose computer.

In some embodiments, a communication device(s) is in data communication with the processor(s) to allow communication with one or more external computing devices, networks, or components. In some embodiments, the communication device is a network communications device, such as a wireless (e.g., Wi-Fi) antenna. In some embodiments, the communication device is a short-range wireless communication, such as a BLUETOOTH connection or a Wi-Fi-Direct connection, that allows data communication between the electronic device and electronic devices in proximity to the electronic device. In some embodiments, the communication device is a near-field communications (NFC) device that is used for data communication, wireless charging of other components and/or accessory devices, or both.

Because the components described herein are susceptible to electromagnetic damage or interference, the housing of the electronic device is conventionally radiopaque. In some embodiments, a RF window in the first portion and/or second portion allows the communication device to broadcast and receive RF signals through the housing of the electronic device. In some embodiments, the covering material is radiotransparent to allow RF signals through the covering without visible seams or welds.

In some embodiments, an electronic device according to the present disclosure includes a body that supports one or more of the electronic components described herein. A covering is applied to the body to improve the visual appeal, tactile appeal, grip, durability, and other properties of the electronic device. For example, a seamless covering that wraps around a portion of the device may be aesthetically pleasing to a user. In some examples, a seamless covering may provide abrasion resistant and be more durable than the housing without the covering. In some examples, a seamless covering may provide a user with a more easily gripped surface for carrying a portable electronic device than a conventional metal or plastic surface.

In some embodiments, an electronic device has a display and/or an input device affixed to the body. In some embodiments, the display is a touch-sensitive display and the display and input device are one and the same. In some embodiments, the body of the electronic device has one or more openings to access connection ports and allow communication with other electronic components located in an interior volume of the electronic device.

A covering is applied to the body, in some embodiments, before at least some of the components are affixed to the body. At least one of the components that is later affixed to the body may apply a force to the covering to hold the covering in contact with and/or in place on the body. In some embodiments, the covering extends from a first edge of the body to a second edge of the body. In some embodiments, the covering is continuous around the body and at least a portion of the covering is positioned underneath a component or a cap layer (e.g., between the component or cap layer and the body).

In some embodiments, the covering seamlessly wraps around at least one edge of the body such that the covering material is continuous from a top surface of the body to a bottom surface of the body. In contrast to a conventional covering applied to a body, there is no prayer seam or weld along the edge and there is no butt seam where two pieces of the covering material are adjacent to and/or contact one another at their respective edges. Each conventional design introduces potential failure or delamination points and can produce unpleasant tactile experiences for a user.

In some embodiments, a covering according to the present disclosure wraps around a plurality of edges of the body. The covering may wrap around a first edge of the body from a top surface to a bottom surface and continue across the body surface to a second edge of the body where the covering material wraps the second edge from the bottom surface to the top surface. In some embodiments, the covering further continues across the top surface to first edge as a continuous loop of material.

The first edge and second edge may be positioned opposite one another, such as a front edge of a laptop keyboard and an opposing rear edge of the laptop keyboard. In another example, the first edge is a top edge of a tablet computer display (e.g., the top portion of the bezel) and the second edge is an opposing bottom edge of the tablet computer. In another example, the first edge is a left edge of a foldable mobile computing device (e.g., a book-style folding device) when in an open posture and the second edge is a right edge of the foldable mobile computing device.

In some embodiments, the covering wraps around all edges of the body, such as all four edges of a rectangular device (e.g., a tablet computing device, a first portion or a second portion of a laptop-style device), three edges of a triangular device (e.g., a speaker), or a curved edge or edges of a rounded rectangular device, a circular device, or an elliptical device (e.g., a wearable device).

In some embodiments, the covering is crushed by an overlapping cap layer. The fibers or material of the covering may be plastically deformed by the contact with the cap layer. In some embodiments, the covering crushed the fibers and mechanically restrains the covering such that the covering does not move relative to the cap layer. In some embodiments, the portion of the covering material contacting the cap layer is restrained by the cap layer, but other portions of the covering material are able to move relative to the cap layer. By allowing other portions to move, the covering material may elastically deform in response to changes in the electronic device's posture or shape.

In some embodiments, the cap layer 328 is positioned against the body 320 to form with the seal 326 with a pressure greater than 50 pounds per square inch (psi). In some embodiments, the cap layer 328 is positioned against the body 320 to form with the seal 326 with a pressure greater than 35 psi. In some embodiments, the cap layer 328 is positioned against the body 320 to form with the seal 326 with a pressure greater than 60 psi.

In some embodiments, the pressure is applied with heat to heat at least the covering 322 at the seal 326 in a range having an upper value, a lower value, or upper and lower values including any of 50° Celsius (C), 55° C., 60° C., 65° C., 70° C., 75° C., 80° C., 85° C., 90° C., or any values therebetween. In some embodiments, the temperature is greater than 50° C. In some embodiments, the temperature is less than 90° C. In some embodiments, the temperature is between 50° C. and 90° C. In some embodiments, the temperature is between 55° C. and 80° C. In some embodiments, the temperature is between 60° C. and 70° C. In some embodiments, the temperature is about 60° C.

In some embodiments, the pressure is applied for a time duration in a range having an upper value, a lower value, or upper and lower values including any of 10 seconds, 15 seconds, 20 seconds, 25 seconds, 30 seconds, 35 seconds, 40 seconds, 45 seconds, 50 seconds, 55 seconds, 60 seconds, or any values therebetween. In some embodiments, the time duration is greater than 15 seconds. In some embodiments, the time duration is less than 60 seconds. In some embodiments, the time duration is between 15 and 60 seconds. In some embodiments, the time duration is between 15 and 45 seconds. In some embodiments, the time duration is between 15 and 30 seconds. In some embodiments, the time duration is about 20 seconds. In at least one embodiment, the time duration is about 20 seconds and is applied at about 50 psi and 60° Celsius.

In some embodiments, the thickness of the covering material is substantially uniform across the covering (e.g., within 5% to 10% of an average thickness). In some embodiments, the thickness of the covering material varies across the covering. The thickness may change at or near a seal with the cap layer. For example, the covering may be thinner near the seal to reduce compliance between the cap layer and the body when the cap layer forms an interference fit with the body. In another example, the covering may be thicker at or near the seal to allow a larger amount of deformation of the covering and limit gaps forming in the seal that are aesthetically unpleasant and/or potential failure points.

In some embodiments, the cap layer is part of an electronic component of the electronic device. For example, the cap layer that plastically deforms the covering may be a cover glass for a display. In some examples, the cap layer may be a PCB underneath an input device. In some examples, the cap layer may be a top plate for a keyboard. In some embodiments, the cap layer is a second body panel of the body.

The surface of the electronic device at the seal of the covering, in some embodiments, is substantially flush with little or no discernible relief in a surface plane. In some embodiments, a step in the surface plane across the seal is less than 1 millimeter. In some embodiments, a step in the surface plane across the seal is less than 0.4 mm. In some embodiments, a step in the surface plane across the seal is less than 0.2 mm. In some embodiments, a step in the surface plane across the seal is less than 0.1 mm.

In some embodiments, a gap between the cap layer and the body panel at the seal is less than 0.5 mm. In some embodiments, a gap between the cap layer and the body panel at the seal is less than 0.25 mm. In some embodiments, a gap between the cap layer and the body panel at the seal is less than 0.1 mm.

In some embodiments, the cap layer is removable, such as to facilitate repair or modification of the electronic components of the device. When the cap layer is removed the compression on the seal is removed. In some embodiments, the covering is then removable or replaceable for cleaning, repair, or modification.

In some embodiments, the covering is pulled taut around at least one edge and/or across a surface of the body. In some embodiments, at least a portion of the covering is adhered to the body with an adhesive (e.g., a pressure sensitive adhesive layer) positioned between the covering and the body panel. For example, the covering may be adhered to the bottom surface of a body panel while allowing a portion of the covering to slide relative to the body panel around an edge of the body panel.

When the covering is free to slide on the edge, the covering can stretch as the cap layer contacts and deforms a part of the covering at the seal. In some embodiments, the cap layer can be a protective/durable layer that provides wear resistance. In some embodiments, the cap layer can be part of an electronic component of the electronic device, such as part of the display, part of an input device, or part of another electronic component or bezel around an electronic component such as connection ports.

The covering may extend over surfaces and edges of the electronic device and conceal underneath it one or more electronic components that emit and/receive a signal through the covering. In some embodiments, a communication device emits and/or receives a RF signal and the covering material is radiotransparent. In some embodiments, a communication device emits or receives an optical signal, and the covering material is translucent or transparent to the wavelengths of light of the optical signal. In some embodiments, at least one status light emits visible light through the covering.

In some embodiments, the covering material is textile, such as a woven organic or synthetic fiber. In some examples, the textile is wool, cotton, polyester, nylon, or other fiber. In some embodiments, the covering material is a perforated material. In some examples, the perforated material allows light from an optical module through the perforations and is otherwise opaque to obscure the optical module when darkened. The perforated material may be leather, ALCANTARA®, a polymer, vinyl, metal, or other continuous material. In at least one example, the covering material spans a RF window gap in the housing, such as an open or perforated region of an aluminum housing. In at least another example, the covering material is a discrete layer applied to the housing of the electronic device, such as a transmissive textile or a perforated leather applied to an RF window, such as a radiotransparent polymer window.

As described herein, some embodiments according to the present disclosure have a covering that is partially fixed to the body and partially free to elastically deform under tension from hinges or other changes in posture. In some embodiments, a covering is seamless and continuous around the edge(s) of a first portion to a second portion of an electronic device. The covering extends across a hinge or other flexible or movable portion connecting the first portion to the second portion. When a user moves the hinge to close the first portion relative to the second portion, the covering may elastically deform over the hinge to stretch. When a user opens the electronic device toward a book-style posture or a laptop posture, the covering contracts to remain in tension around the hinge.

In some embodiments, the covering is captured by a cap layer on the first portion and the second portion to affixed the covering to the edges of the first portion and the second portion. In some embodiments, the covering is additionally adhered to surfaces of the first portion and the second portion to limit and/or prevent movement or elastic deformation of the covering across the surfaces. To reduce wear of the covering on the hinge components, a low-friction material is positioned, in some embodiments, between the covering and the hinge components. For example, a layer of polyurethane is positioned to allow the covering to slide past the hinge without the covering experiencing wear or damage from the hinge components and/or to allow the hinge to operate without interference from the covering or fibers from the covering material.

In some embodiments, a body of an electronic device has a bendable or foldable portion. The covering is adhered to areas and/or surfaces of the electronic device proximate the bendable or foldable portion while allowing the covering to stretch and/or contract during movement of the bendable or foldable portion.

In some embodiments, a method of manufacturing an electronic device with a seamless covering includes applying a covering to a body panel where the body panel has a top surface, a bottom surface, and an edge between the top surface and the bottom surface. The method further includes wrapping the covering around the edge from the bottom surface to the top surface such that the covering is continuous from the bottom surface to the top surface. A cap layer is then pressed against the covering on the top surface to compress and plastically deform the covering at a seal on the top surface. In some embodiments, the seal compresses the covering between the body panel and the cap layer in a direction perpendicular to the top surface. In some embodiments the cap layer is positioned in a recess or in the interior volume of the body panel.

By compressing the covering between the cap layer and the body panel, the covering may be pulled taut and retained by the cap layer on the surface(s) and around the edge(s) of the body panel. The covering can, therefore, provide a outer surface of the housing that is visually and tactilely seamless. The seamless covering can reduce potential failure points, provide a more comfortable contact surface for users to touch, and provide concealment for RF windows, speaker meshes, or other openings, apertures, or discontinuities in the body panels.

The present disclosure relates to systems and methods for providing a seamless covering on an electronic device according to at least the examples provided in the sections below:

1. An electronic device housing comprising:
   a body panel (e.g., 220, 320, 420-1, 620) having a top surface (e.g., 327, 627), a bottom surface (e.g., 329, 629) and an edge (e.g., 224, 324-1, 324-2, 424) between the top surface and bottom surface;
   a covering (e.g., 222, 322, 422, 522, 622, 722) positioned on the bottom surface, the top surface, and the edge such at the covering is continuous from the bottom surface to the top surface; and
   a cap layer (e.g., 328, 420-2, 728) positioned on the top surface to compress a portion of the covering at a seal (e.g., 326, 426), where the portion of the covering at the seal is compressed between the cap layer and the body panel.

2. The housing of section 1, further comprising an adhesive layer (e.g., 536) between the covering and the bottom surface of the body panel.
3. The housing of sections 1 or 2, wherein a thickness of the covering is uniform across an outer surface (e.g., 431) of the body panel.
4. The housing of any preceding claim, wherein the covering is radiotransparent.
5. The housing of any preceding claim, wherein the covering includes a textile.
6. The housing of any preceding claim, wherein a surface plane (e.g., 432) of the top surface has a relief at the seal of less than 1.0 millimeter.
7. The housing of any preceding claim, wherein a gap between the body panel and cap layer is less than 0.5 millimeters in the seal (e.g., 426).
8. The housing of any preceding claim, wherein the edge is a first edge (e.g., 324-1) and the covering is continuous across the bottom surface (e.g., 329) to a second edge (324-2) of the body panel opposite the first edge, and the covering wraps around the second edge to a second seal.
9. The housing of section 8, wherein the covering is a continuous and seamless piece of covering material around the bottom surface, first edge, top surface, and second edge of the body panel.
10. The housing of any preceding claim, wherein the covering has no visible or tactile seams on an outer surface (e.g., 431) of the electronic device housing.
11. The housing of any preceding claim, wherein the body panel is circular or elliptical and the edge of the body panel is a curved edge, and the covering extends around all of the curved edge.
12. The housing of any preceding claim, wherein the covering includes an elastic covering material (e.g., elastic portion 534, 634).
13. A method of manufacturing an electronic device, the method comprising:
    applying (e.g., 742) a covering to a body panel, the body panel having a top surface, a bottom surface and at least one edge between the top surface and bottom surface;
    wrapping (e.g., 744) the covering around the edge from the bottom surface to the top surface such that the covering is continuous from the bottom surface to the top surface; and
    compressing (e.g., 746) the covering against the top surface with a cap layer to plastically deform the covering at a seal on the top surface.
14. The method of section 13, wherein the covering is elastically stretched around the edge.
15. The method of sections 13 or 14 further comprising adhering the covering to the bottom surface.
16. The method of any of sections 13-15 further comprising adhering the covering to the top surface.
17. The method of any of sections 13-16, wherein compressing the covering includes applying at least 25 pounds per square inch of pressure to the cap layer.
18. The method of any of sections 13-17, wherein compressing the covering includes reducing a thickness of the covering to less than 75% of a starting thickness.
19. An electronic device housing comprising:
    a body panel having a top surface, a bottom surface and an edge between the top surface and bottom surface;
    a covering positioned on the bottom surface, the top surface, and the edge such at the covering has no visible or tactile seams on an outer surface of the electronic device housing.

20. The electronic device housing of section 19, wherein the edge is a first edge, and the body panel further includes a second edge, third edge, and fourth edge; and
wherein the covering is further positioned on and covering the second edge, third edge, and fourth edge to cover all of an outer surface of the body panel.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. An electronic device housing comprising:
a body panel having external surfaces including a top surface and a bottom surface with an edge between the top surface and the bottom surface;
a cap layer affixed to the body panel;
a covering enclosing external surfaces of body panel such that the covering has no visible or tactile seams, wherein the electronic device is a keyboard,
wherein the top surface of the external surfaces of the body panel includes a plurality of keys,
wherein the covering is a flexible fabric covering adhered to the body panel and covering the bottom surface and the edge, the fabric covering covering the top surface with apertures for the plurality of keys, wherein there is no visible or tactile seams between the covering and the cap layer.

2. The electronic device housing of claim 1, wherein the cap layer is inset into the body panel such that the cap layer does not extend beyond an edge surface of the body panel.

3. The electronic device housing of claim 1, wherein the cap layer includes at least one of: a display, a keyset, and a touch pad.

4. The electronic device housing of claim 1, wherein the covering includes one or more of the apertures and the covering is positioned such that the one or more apertures allow user access to the body panel.

5. The electronic device housing of claim 1, wherein the body panel includes a hinge section and wherein the fabric covering has an elastic portion that covers the hinge section.

6. The electronic device housing of claim 1, wherein the edge is a first edge, and the body panel further includes a second edge, third edge, and fourth edge; and
wherein the covering is further positioned on and covering the second edge, third edge, and fourth edge to cover all of an outer surface of the body panel.

7. The electronic device housing of claim 1, further comprising an adhesive layer between the covering and an external surface of the body panel.

8. The electronic device housing of claim 1, wherein a thickness of the covering is substantially uniform across an outer surface of the body panel.

9. The electronic device housing of claim 1, wherein the covering is radiotransparent.

10. The electronic device housing of claim 1,
wherein the fabric covering covers the bottom surface and the edge such that the covering is continuous from the bottom surface to the edge; and
the cap layer affixed to the fabric covering with a seal between the cap layer and the body panel, wherein a portion of the fabric covering of the body panel at the seal is compressed between the cap layer and the body panel to reduce a gap size between the body panel and the cap layer.

11. The electronic device housing of claim 1, wherein the edge is a first edge and the covering is continuous across the bottom surface to a second edge of the body panel opposite the first edge, and the covering wraps around the second edge to a second seal.

12. The electronic device housing of claim 1, wherein the flexible fabric covering visually hides components beneath the flexible fabric to provide the appearance of a continuous outer surface while covering the components.

13. The electronic device housing of claim 12, wherein the components include an RF window such that the flexible fabric covering visually hides the RF window beneath the flexible fabric to provide the appearance of a continuous outer surface while allowing RF signal to pass through the RF window and the flexible fabric covering.

14. The electronic device housing of claim 10, wherein a surface plane of the top surface has a relief at the seal of less than 1.0 millimeter.

15. The electronic device housing of claim 10, wherein the fabric covering is composed of polyester and polyurethane.

16. An electronic device housing comprising:
- a body panel having external surfaces including a top surface and a bottom surface with an edge between the top surface and the bottom surface;
- a cap layer affixed to the body panel;
- a covering enclosing external surfaces of body panel such that the covering has no visible or tactile seams, wherein the electronic device is a keyboard,
  - wherein the top surface of the external surfaces of the body panel includes a plurality of keys, the cap layer affixed to the fabric covering with a seal between the cap layer and the body panel, wherein a portion of the fabric covering of the body panel at the seal is compressed between the cap layer and the body panel to reduce a gap size between the body panel and the cap layer.

* * * * *